United States Patent
Petschaurer et al.

(10) Patent No.: US 6,461,479 B1
(45) Date of Patent: *Oct. 8, 2002

(54) PROCESS AND DEVICE FOR DISTRIBUTING A PULP SUSPENSION, PARTICULARLY AT MEDIUM CONSISTENCY

(75) Inventors: Franz Petschaurer, Lannach; Reinhard Pinter, deceased, late of Stattegg, by Maria Ilona Pinter, legal representative; Adolf Engler, Graz, all of (AT)

(73) Assignee: Ádritz-Patentverwaltungs-Gesellschaft m.b.H., Graz (AT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/202,765
(22) PCT Filed: Jun. 9, 1997
(86) PCT No.: PCT/EP97/02997
§ 371 (c)(1),
(2), (4) Date: May 10, 1999
(87) PCT Pub. No.: WO98/00603
PCT Pub. Date: Jan. 8, 1998

(30) Foreign Application Priority Data
Jun. 27, 1996 (AT) .............................................. 1136/96

(51) Int. Cl.$^7$ ................................................. D21F 1/02
(52) U.S. Cl. ...................... 162/212; 162/214; 162/216; 162/339
(58) Field of Search ................................ 162/216, 214, 162/212, 210, 209, 208, 339, 340, 341, 342, 343, 218; 415/115, 169.1, 144, 143, 58.7

(56) References Cited

U.S. PATENT DOCUMENTS

| | | | | |
|---|---|---|---|---|
| 2,736,247 A | * | 2/1956 | Hornbostel | 162/340 |
| 3,432,384 A | * | 3/1969 | Dahl | 162/338 |
| 4,637,779 A | * | 1/1987 | Sherman et al. | 415/143 |
| 4,729,837 A | * | 3/1988 | Henricson | 210/784 |
| 4,884,943 A | * | 12/1989 | Niskanen | 415/143 |
| 4,981,413 A | * | 1/1991 | Elonen et al. | 415/115 |
| 4,995,988 A | * | 2/1991 | Ahlgren | 210/784 |
| 5,000,658 A | * | 3/1991 | Niskanen | 415/143 |
| 5,160,584 A | * | 11/1992 | Fredriksson | 162/318 |

FOREIGN PATENT DOCUMENTS

| | | | |
|---|---|---|---|
| WO | 88/05840 | * | 8/1988 |

* cited by examiner

*Primary Examiner*—Jose Fortuna
(74) *Attorney, Agent, or Firm*—Alix, Yale & Ristas, LLP

(57) ABSTRACT

The invention relates to a process for distributing an especially medium-consistent fibrous suspension in front of a dewatering device. It is distinguished in that the fibrous suspension is taken to the dewatering device in fluidized form and evenly distributed. The invention also relates to a device for implementing the process in which there is a closed device with a fluidizing rotor in front of the dewatering device.

33 Claims, 2 Drawing Sheets

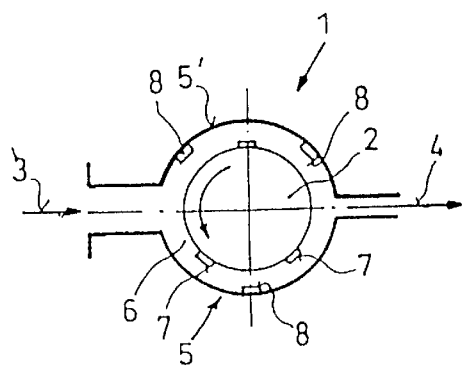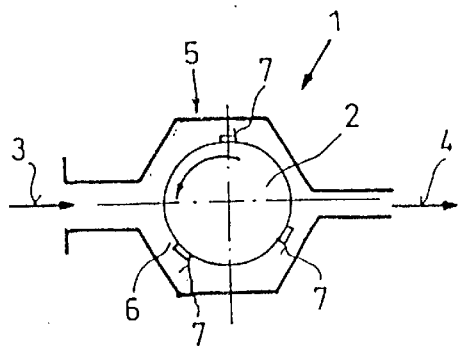
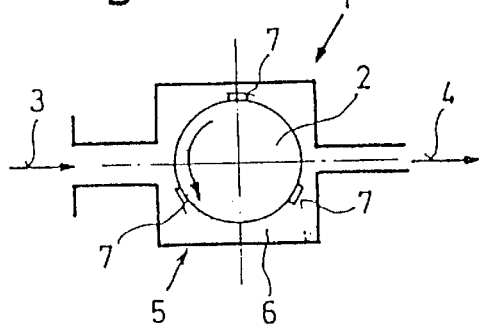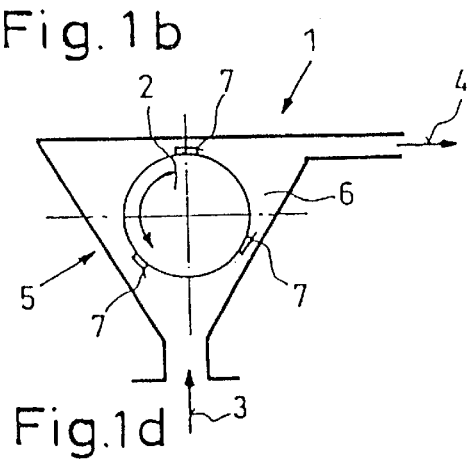
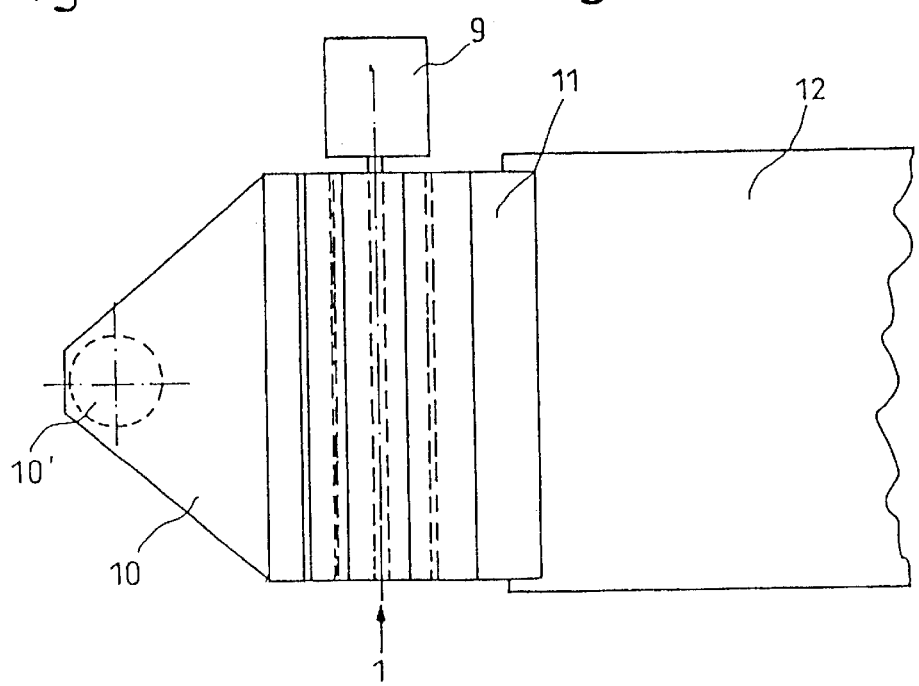

PROCESS AND DEVICE FOR DISTRIBUTING A PULP SUSPENSION, PARTICULARLY AT MEDIUM CONSISTENCY

CROSS REFERENCE TO RELATED APPLICATION

This is the national phase of International Application No. PCT/EP97/02997 filed Jun. 9, 1997.

BACKGROUND OF THE INVENTION

The invention relates to a process for distributing a pulp suspension, particularly at medium consistency, upstream of a dewatering device. In addition, it relates to a device for implementing the process.

As a rule, pulp suspensions are dewatered on Fourdrinier machines, i.e. machines where the suspension is dewatered on a bottom wire, and on twin wire presses, where the suspension is fed in and dewatered between two wires.

For "thicker" suspensions, e.g. in the medium-consistency range, twin wire presses with an open headbox are used in most cases. In order to guarantee adequate distribution of the pulp suspension over the belt width of the twin wire press, special measures are required, such as additional distribution rolls, suitable slide panels, or similar. At high consistencies, however, this does not yet guarantee complete and even distribution, resulting in different thicknesses of material web being produced over the machine width. Particularly in subsequent washing processes and for even dewatering, however, this can be a considerable disadvantage. Even with the means otherwise used for homogenizing, it is impossible to achieve subsequent even distribution over the width of the web or the machine.

Patent WO-A-8805840 (Ahlstrom) describes a process and a device for spreading chemical pulp over a belt. To improve distribution, the "high-consistency" suspension is fluidized by an agitator. This is achieved with high energy input and an agitator circumferential speed of at least 25 m/s, causing the suspension to be fluidized in the web formation point.

Patent U.S. Pat. No. 3,119,734 (Jordan) describes feeding of a chemical pulp suspension onto the wire belt of a paper machine. A perforated roll 30 with toothing made of rubber is provided here to distribute the (low-consistency) suspension.

SUMMARY OF THE INVENTION

The aim of the invention is to avoid the above mentioned disadvantages, and to guarantee good feed and even distribution of the suspension over the dewatering device for all consistencies of the pulp suspension, particularly in the medium-consistency range. for the suspension to flow evenly over the width of the machine to a large extent and be distributed.

An advantageous further development of the invention is characterized by fluidization taking place in an enclosed area, which means that a constant pressure can be set independently of the flow rate, thus achieving constant, even distribution.

A favorable configuration of the invention is characterized by the pulp suspension having a consistency between 0.5% and 18%, preferably between 5% and 12%. Optimum distribution is obtained particularly in this consistency range due to fluidization of the pulp suspension.

A favorable further development of the invention is characterized by fluidization taking place at a pressure above atmospheric. At higher pressure it is possible to achieve a higher throughput and dewatering capacity on the one hand, and on the other, improved homogenizing of the suspension is achieved over the web width.

An advantageous configuration of the invention is characterized by the suspension being fed to the fluidization process after already having been predistributed. In this case, even better distribution of the suspension is achieved at the inlet to the dewatering machine.

A favorable further development of the invention is characterized by the cross-profile being controlled after fluidization. This allows compensation of the various influencing factors that are difficult to control.

An advantageous further development of the invention is characterized by the speed of the rotor being controlled as a function of the differential pressure between inlet and outlet. Thus, the optimum output can be set for the rotor.

In addition, the invention refers to a device to implement the process for distribution of a pulp suspension, particularly at medium consistency, upstream of a dewatering device. It is characterized by an enclosed device with a fluidizing rotor being installed upstream of the dewatering device. Due to this rotor the pulp suspension can be reduced effectively to a liquid state, particularly at medium consistency, which means it can be distributed easily over the web width.

A favorable further development of the invention is characterized by the fluidizing rotor having burls, strips, or profiles, such as polygons, spikes or comb-shaped built-in components. Fluidization of the pulp suspension can thus be achieved in a favorable way.

An advantageous configuration of the invention is characterized by the gap between the rotor and the walls of the casing being essentially constant all the way round. This means that the suspension can flow evenly round the rotor in both directions, which causes even better swirling and thus, better fluidizing of the suspension.

An advantageous further development of the invention is characterized by the casing having burls, strips, or profiles, such as polygons, spikes or comb-shaped built-in components, with a gap of between 1 and 100 mm between the rotor and the casing or between whatever built-in components are used. This is a favorable means of preventing the suspension from turning together with the rotor. Thus, the efficiency of the fluidization process is enhanced.

A favorable configuration of the invention is characterized by the casing having a circular cross-section, however it can also have a triangular or polygonal cross-section. The angular shape, in particular, assists fluidization of the suspension in an advantageous manner, whereas the circular shape is simpler and cheaper to manufacture.

A favorable further development of the invention is characterized by a cross-flow distributor, funnel-type headbox, or several feed pipes being provided upstream of the distribution device. If the suspension is pre-distributed, it can be fluidized more easily and then distributed over the width of the machine more evenly.

A favorable configuration of the invention is characterized by the outlet opening being located above a bottom wire. Thus, the suspension can be distributed evenly on a Fourdrinier wire in a favorable manner.

An advantageous further development of the invention is characterized by the outlet opening being located between two wires.

An advantageous configuration of the invention is characterized by the outlet gap to the cross-profile control being pre-set, however it can also be adjustable. If the outlet gap is pre-set, any desired cross profile can be obtained in a favorable way. If the outlet gap is adjustable, it can be used to compensate any influencing factors that are difficult to control or which change from time to time.

BRIEF DESCRIPTION OF THE DRAWINGS

The invention will now be described in examples and referring to the drawings, where FIGS. 1 a–d show various design forms of the invention, FIG. 2 contains a horizontal projection of FIG. 1c.

DESCRIPTION OF THE PREFERRED EMBODIMENTS

Figure 3:
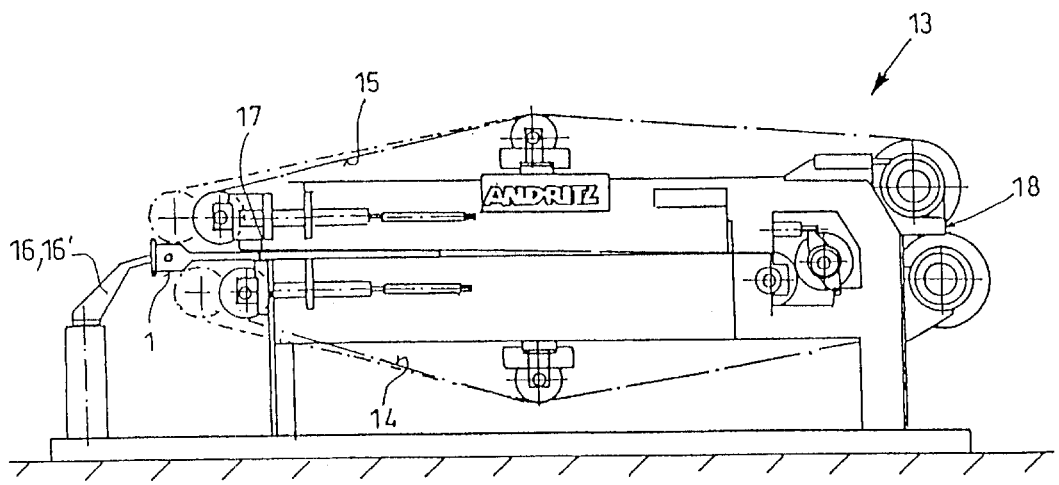
FIG. 3 shows the invention in connection with a dewatering machine, and FIG. 4 contains a view of FIG. 3

FIG. 1a shows a device 1 according to the invention with circular cross-section. The fluidization rotor 2 is mounted in the center, with a constant gap here between the rotor 2 and the wall of the casing 5', i.e. the gap is the same all the way round. The rotor 2 can, however, also be mounted in the casing eccentrically. The suspension is fed into the casing 5 at 3 and discharged again at 4. It is important here that the suspension at 6 does not rotate together with the rotor 2. Elements 7, such as strips or also combs, are mounted on the rotor 2. On the casing all 5' there are also elements 8 provided, such as strips or combs. This an prevent the suspension from rotating together with the rotor 2, and fluidization is increased. If the elements 7 and 8 used are combs, these can also mesh into one another during rotation. FIG. 1b shows a different form of device with a hexagonal (polygonal) cross section. In many cases, no elements 8 are needed here on the wall of the casing 5' because the corners have a similar effect. The same applies to FIG. 1c, showing the device according to the invention with a square cross section, and to FIG. 1d, with a triangular cross section. As shown in FIG. 1d, the elements 7 at the rotor 2 can also be omitted under certain circumstances. In order to fluidize the pulp, the rotor 2 has a circumferential speed of 10 to 20 m/s.

FIG. 2 shows the arrangement of the device 1 according to FIG. 1c in connection with a preceding funnel-type headbox 10 and the feed pipe 10' leading to it. The device I is driven here by a motor 9. The outlet gap 11 extends over the entire width of a wire 12, which can be the bottom wire of a Fourdrinier machine.

FIG. 3 shows the arrangement of the invention installed upstream of a twin wire belt press 13 with a bottom wire 14 and a top wire 15. The pulp suspension is fed through a pressure headbox 16, 16' to the device 1 and from there into the gap 17 between the wire belts 14, 15. The dewatered material web then leaves the twin wire belt press 13 at 18. In some cases, the material web can also be washed between the gap 17 and the discharge point 18 from the twin wire belt press 13.

Figure 4:
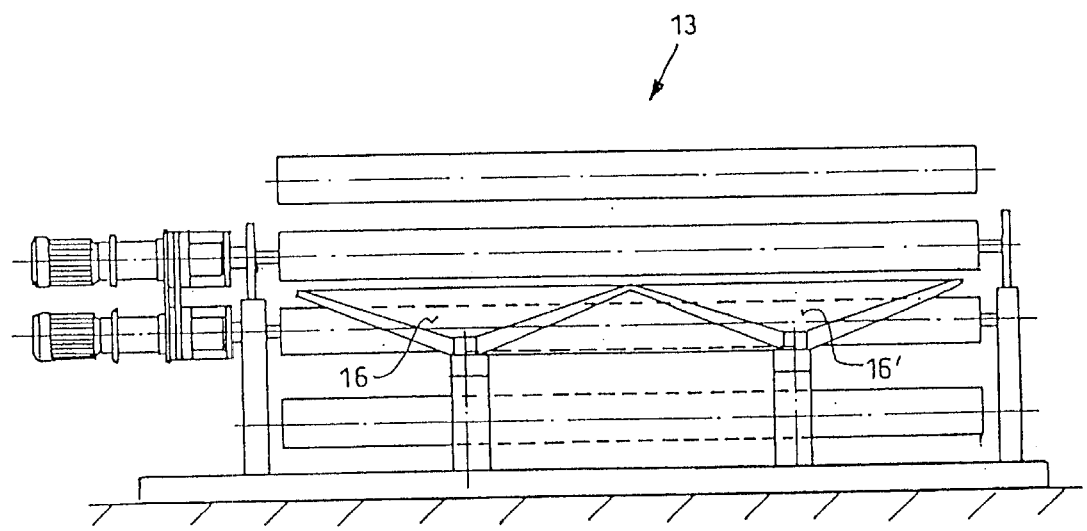

FIG. 4 provides a view of the twin wire belt press 13, where in particular the suspension feed through two funnel-type headboxes 16, 16' is clearly shown. With this arrangement, effective distribution is achieved even before the pulp suspension is fluidized, and more even fluidization is also made possible.

What is claimed is:

1. A process for distributing a pulp suspension, comprising the steps of:

feeding a pulp suspension having a consistency within the range of 6% to 15% at a first pressure into an enclosed, elongated casing containing an elongated rotor spinning around a rotational axis;

fluidizing the pulp suspension in the casing with the rotor at a pressure greater than atmospheric;

discharging the fluidized pulp suspension at a second pressure; and distributing the pulp suspension while still in an essentially fluidized state across the entire width of a dewatering device located immediately adjacent the casing.

2. A process as in claim 1 wherein the step of feeding comprises providing the pulp suspension to more than one position within the elongated casing at the same time.

3. A process as in claim 1 further comprising depositing the pulp suspension while still in an essentially fluidized state onto a belt of the dewatering device to form a pulp web with a controlled profile.

4. A process for distributing a pulp suspension having a consistency within the range of 6% to 18% comprising fluidizing the pulp suspension in an enclosed space at a first pressure above atmospheric and subsequently distributing the fluidized pulp suspension to a dewatering device to form a pulp web wherein a rotor is mounted for rotation at a speed within said enclosed space and comprising the steps of feeding the pulp suspension at a feed pressure to the enclosed space for fluidizing by said rotor; discharging the fluidized pulp at a discharge pressure and controlling the speed of the rotor as a function of the difference between the feed and discharge pressures.

5. The process of claim 4 comprising the step of substantially predistributing the pulp suspension into the enclosed space for fluidizing.

6. The process of claim 4 comprising the step of controlling a cross-profile of said pulp web after said fluidizing step.

7. A device for distributing a pulp suspension having a consistency within the range of about 6% to about 15%, comprising:

an enclosed casing with internal walls defining a cavity;

a fluidizing rotor mounted for rotation at a rotational speed within the cavity, said rotor having a fluidizing surface, wherein pulp suspension is fluidized between the rotor and the internal walls;

a gap defined by the shortest distance between the internal walls of the casing and the fluidizing surface;

means for rotating the rotor;

inlet means for feeding a pulp suspension at a first pressure into the casing; and outlet means for discharging fluidized pulp suspension from said casing to a web forming element of an adjacent dewatering device wherein the pulp suspension remains essentially fluidized through the outlet means.

8. A device as in claim 7 wherein the rotor has a polygonal cross-section.

9. A device as in claim 7, wherein the fluidizing surface further comprises at least one projection extending therefrom.

10. A device as in claim 7, wherein the casing internal walls further comprise at least one projection extending therefrom.

11. A device as in claim 7 wherein the gap is between 1 and 100 millimeters.

12. A device as in claim 7 wherein the inlet means comprises at least one member selected from the group consisting of a cross-flow distributor, a funnel-type headbox and a plurality of feed pipes.

13. A device as in claim 7 wherein the outlet means comprises a cross profile control.

14. A device as in claim 7, wherein the device comprises an unobstructed fluid path from the cavity to the dewatering device.

15. The device of claim 7 wherein the casing and the rotor extend across substantially an entire width of the dewatering device.

16. The device of claim 7 wherein the web forming has a travel direction and the casing and the rotor are disposed essentially perpendicular to the travel direction.

17. The device of claim 7 wherein the outlet means comprises an outlet projecting from the casing.

18. A device for fluidizing a pulp suspension having a consistency from about 6% to about 18% and distributing the fluidized pulp suspension to a dewatering device comprising:

a casing with walls defining an internal cavity;

a fluidizing rotor mounted for rotation at a speed within said cavity;

outlet means extending across the casing and substantially the same width as the dewatering device, wherein the pulp suspension having a consistency from about 6% to about 18% is substantially fluidized within said cavity at a pressure greater than atmospheric and discharged in a substantially fluidized state to said dewatering device.

19. The device of claim 18 wherein the fluidizing rotor comprises a polygonal cross-section.

20. The device of claim 18 wherein the fluidizing rotor comprises a fluidizing surface and the fluidizing surface and the casing walls define a gap, said gap being substantially constant at all angular positions of the rotor.

21. The device of claim 18 wherein the casing walls comprise a burl.

22. The device of claim 18 wherein the casing walls comprise a strip.

23. The device of claim 18 wherein the casing walls comprise a polygonal element projecting therefrom.

24. The device of claim 18 wherein the casing walls comprise a spike projecting therefrom.

25. The device of claim 18 wherein the casing walls comprise a comb shaped component.

26. The device of claim 18 wherein internal cavity defines a circular cross-section.

27. The device of claim 18 wherein the internal cavity defines a polygonal cross-section.

28. The device of claim 18 wherein said outlet means is located above a bottom wire of the dewatering device.

29. The device of claim 18 wherein said outlet means is located between a top and a bottom wire of the dewatering device.

30. The device of claim 18 wherein said outlet means distributes said fluidized pulp substantially across the width of the dewatering device to form a pulp web having a cross-profile, said outlet means comprising an outlet opening for controlling said cross-profile.

31. The device of claim 18 wherein said outlet means distributes said fluidized pulp substantially across the width of the dewatering device to form a pulp web having a cross-profile, said outlet means comprising an adjustable outlet opening for controlling said cross-profile.

32. The device of claim 18 wherein the fluidizing rotor comprises a fluidizing surface and the fluidizing surface has a circumferential speed within the range of 10 meters per second to 20 meters per second when said rotor is rotating.

33. The device of claim 18, wherein the dewatering device is selected from the group consisting of a Fourdrinier machine and a twin wire press.

\* \* \* \* \*

UNITED STATES PATENT AND TRADEMARK OFFICE
CERTIFICATE OF CORRECTION

PATENT NO. : 6,461,479 B1
DATED : October 8, 2002
INVENTOR(S) : Petschauer et al.

It is certified that error appears in the above-identified patent and that said Letters Patent is hereby corrected as shown below:

Title page,
Items [12] and [75], delete "Petschaurer" and insert -- Petschauer --.
Item [73], Assignee, delete "Ádritz" and insert -- Andritz --.

Column 6,
Line 9, after "wherein" insert -- the --.

Signed and Sealed this

Seventeenth Day of June, 2003

JAMES E. ROGAN
*Director of the United States Patent and Trademark Office*